United States Patent [19]

Ha

[11] Patent Number: 5,677,207
[45] Date of Patent: Oct. 14, 1997

[54] METHOD FOR FABRICATING A THIN FILM TRANSISTOR USING SILICIDE LAYER

[75] Inventor: Yong Min Ha, Kyongki-do, Rep. of Korea

[73] Assignee: LG Electronics Inc., Seoul, Rep. of Korea

[21] Appl. No.: 610,933

[22] Filed: Mar. 5, 1996

[30] Foreign Application Priority Data

Oct. 17, 1995 [KR] Rep. of Korea .................. 95-35771

[51] Int. Cl.$^6$ .................. H01L 21/265; H01L 21/84
[52] U.S. Cl. .................. 437/21; 437/44; 437/200
[58] Field of Search .................. 437/41, 44, 200, 437/21

[56] References Cited

U.S. PATENT DOCUMENTS

| | | | |
|---|---|---|---|
| 4,716,131 | 12/1987 | Okazawa et al. | 437/200 |
| 5,221,632 | 6/1993 | Kurimoto et al. | 437/44 |
| 5,508,209 | 4/1996 | Zhang et al. | 437/21 |
| 5,543,340 | 8/1996 | Lee | 437/44 |

FOREIGN PATENT DOCUMENTS

60-113472A 6/1985 Japan .................. 437/44

*Primary Examiner*—John Niebling
*Assistant Examiner*—Richard A. Booth
*Attorney, Agent, or Firm*—Morgan, Lewis and Bockius, LLP

[57] ABSTRACT

A method for forming a thin film transistor includes the steps of depositing a semiconductor layer on a substrate and patterning the semiconductor layer to form an active region, forming a gate insulation layer on the active layer and the substrate, forming a gate conductive layer on the gate insulation layer, forming a metal layer on the gate conductive layer and the gate insulation layer, forming a silicide layer by reacting the gate conductive layer with the metal layer, removing an unreacted portion of the metal layer, forming a high-density impurity region in the active layer by ion-implantation using the silicide layer as a mask, forming a gate electrode by removing the silicide layer, and forming an interlayer insulation layer on the exposed surface of the gate electrode and gate insulation layer.

18 Claims, 6 Drawing Sheets

METHOD FOR FABRICATING A THIN FILM TRANSISTOR USING SILICIDE LAYER

BACKGROUND OF THE INVENTION

1. Field of the Invention

The present invention relates to a method for fabricating a thin film transistor (TFT), and more particularly, to a method for fabricating a TFT in an active matrix liquid crystal display (LCD).

2. Discussion of the Related Art

A TFT is used as a pixel switch device of a TFT-LCD device or a load MOS transistor in a cell of a SRAM. A general polycrystalline silicon TFT has a doped semiconductor layer in a source/drain region with a top gate self-aligned with a gate electrode.

Figure 1:
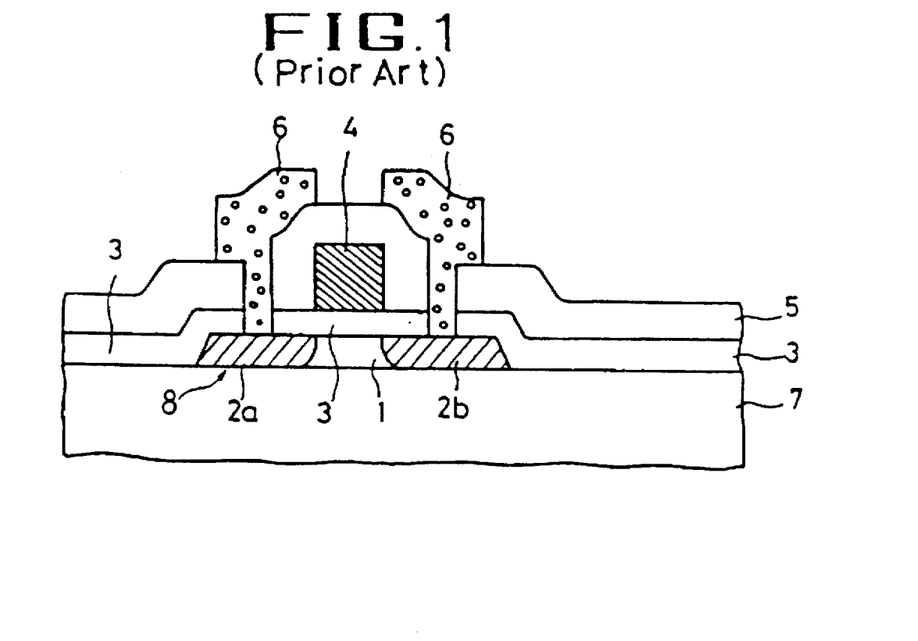
FIG. 1 is a cross sectional view of a conventional TFT.

FIG. 1 is a cross sectional view of a conventional top gate-type TFT. Referring to the drawing, an additional mask for ion implantation is not required when impurity regions of high density are formed since the high density impurity regions ($p^+$ conductive type or $n^+$ conductive type), which function as a source region 2a and a drain region 2b, are formed by implanting ion impurities (p-conductive type or n-conductive type) using a gate electrode 4 as a mask.

In such a manner, since the position of high-density impurity regions for source region 2a and drain region 2b is automatically determined by gate electrode 4, the top gate-type TFT structure is self-aligned. Since the self-aligned structure does not require an additional mask for forming impurity regions when the TFT is fabricated, the process is simplified, and the overlap capacitance between the gate and source/drain region is small compared with other structures.

In FIG. 1, the TFT comprises a channel area 1, a gate insulation layer 3, an interlayer insulation layer 5, contact electrodes 6, and a substrate 7. Here, channel area 1, source area 2a and drain area 2b are formed in an active layer 8. Polysilicon is generally used for the active layer 8.

Figure 2:
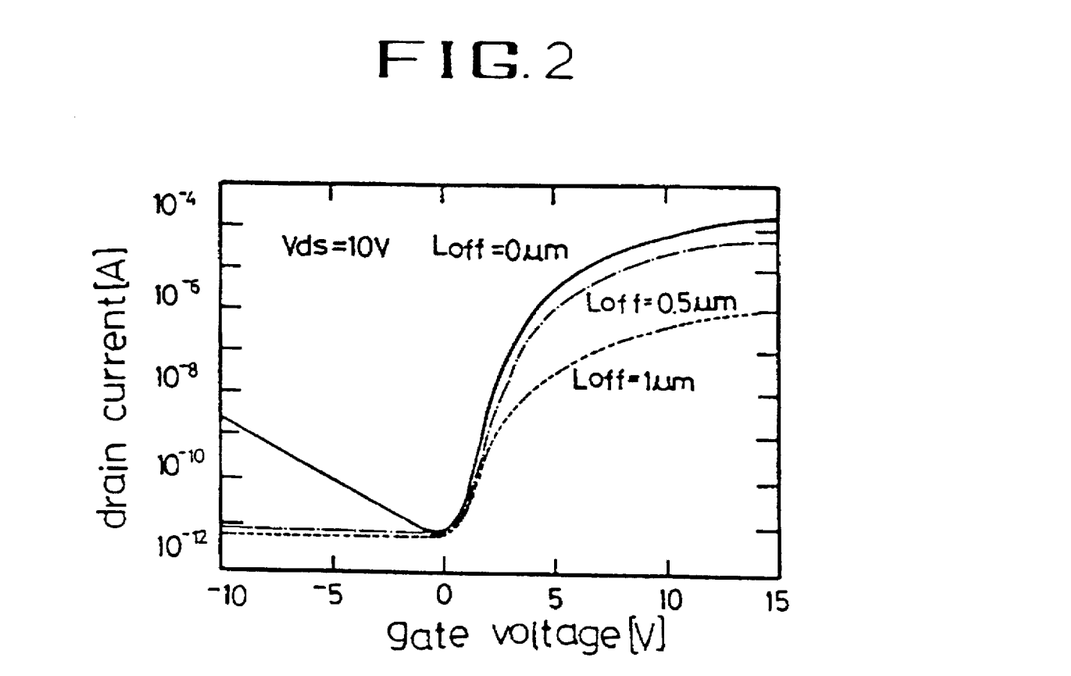
FIG. 2 is a graph of drain current versus gate-source voltage for a TFT.

FIG. 2 is a graph indicating drain current with respect to gate-source voltage. The solid curve indicates the typical characteristics of a general polysilicon TFT. It is noted that significant leakage current flows when the gate-source voltage $V_{gs}<0$, corresponding to an off state of the transistor. In particular, the leakage current increases exponentially as the gate voltage increases in the negative (−) direction. The increase occurs because the carriers captured at trap states in poly silicon(poly-Si) films around the drain junction can tunnel through the carrier of function.

Thus, signal voltage of an LCD is not accurately maintained due to the leakage current when the TFT of FIG. 1 is used as a switching device for driving a pixel of the LCD. If the signal voltage is not maintained, image flickering is generated in the LCD.

As described above, since the leakage current flowing in the drain region increases exponentially with the electric field in the drain region, it is necessary to reduce the electric field between the drain and channel area.

To achieve this, a technique has been proposed which forms offset areas where no ion impurities are doped and LDD (lightly doped drain) areas, which contain less dopants than the heavily doped source/drain areas, by using an additional masking process and ion implanting process between the conventional channel area and the high-density impurity areas which function as the source and drain regions.

Herebelow, a method for fabricating a TFT having a conventional LDD area and offset area will now be described with reference to FIG. 3A to 3G.

Figure 3A:
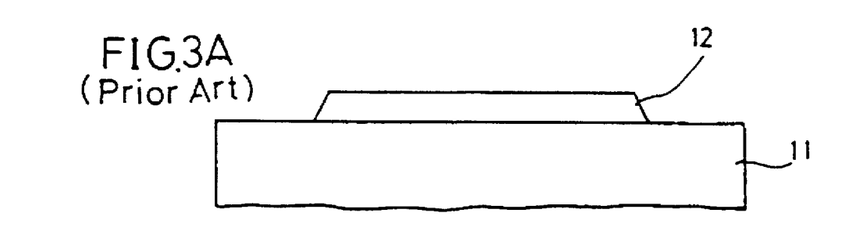
FIGS. 3A–3G are sectional views illustrating the method of forming a conventional TFT.

In FIG. 3A, after a thin film polysilicon for an active layer is formed on a substrate 11, an active layer 12 is formed by patterning the thin film polysilicon. Here, a patterning process includes photolithography and etching processes.

Figure 3B:
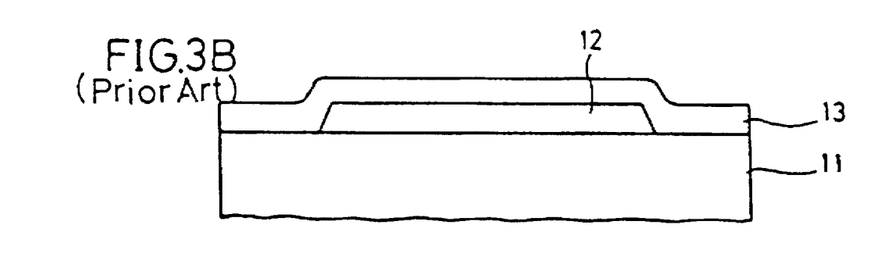

Then, as shown in FIG. 3B, a gate insulation layer 13 is formed on exposed substrate 11 and active layer 12 utilizing a silicon oxide film and silicon nitride film.

Figure 3C:
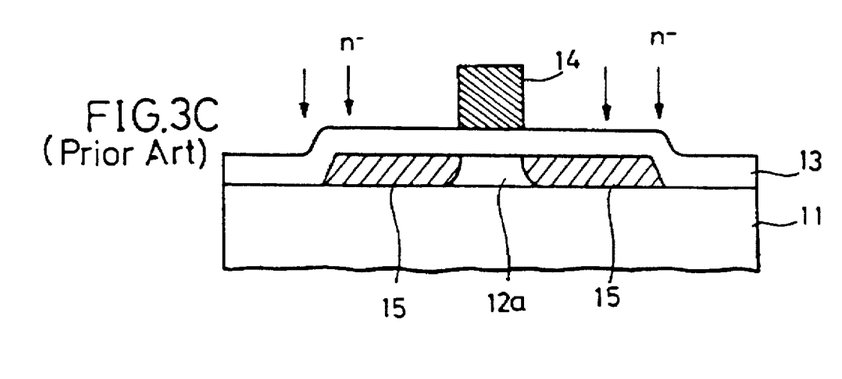

In FIG. 3C, a doped polysilicon layer or a metal layer is formed on gate insulation layer 13 to form a gate electrode, and a gate electrode 14 is formed by patterning the doped polysilicon or metal layer.

Next, to form an LDD area, n-type impurity areas 15, i.e., LDD areas, are formed in active layer 12 by implanting n conductive type (n-type) impurity ions with low dose into active layer 12 through gate insulation layer 13 utilizing gate electrode 14 as a mask. Typically, the dose spread between $1 \times 10^{12}$ to $\times 10^{14}$ /cm$^2$. Here, if an undoped offset area is formed in the relevant areas instead of the LDD areas, the n-type impurity ions are not implanted.

Figure 3D:
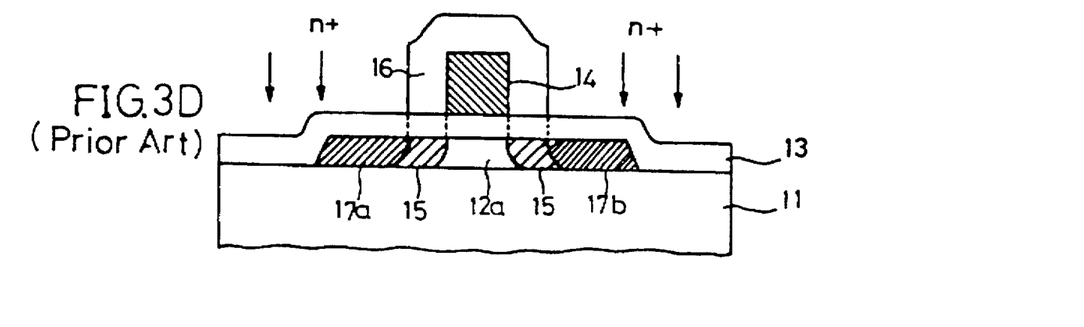

In FIG. 3D, an insulation layer 16, such as a photoresist layer, is formed on the exposed whole surface of gate electrode 14 and gate insulation layer 13. Insulation layer 16 is patterned to remove portions exclusive of a portion over gate electrode 14 and LDD areas 15, as shown in FIG. 3D. The insulation layer 16 serves as a mask for succeeding process steps.

By using the remaining insulation layer 16 as an ion-implantation mask, n type conductive ($n^+$ type) impurity ions are implanted with a high dose into active layer 12 through gate insulation layer 13 so that $n^+$ type impurity areas form a source region 17a and a drain region 17b.

Figure 3E:
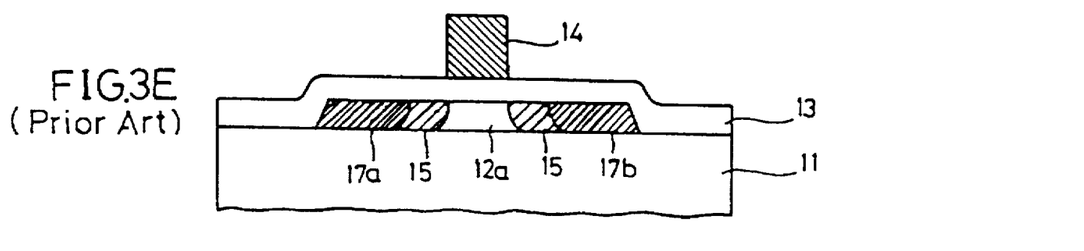
Figure 3F:
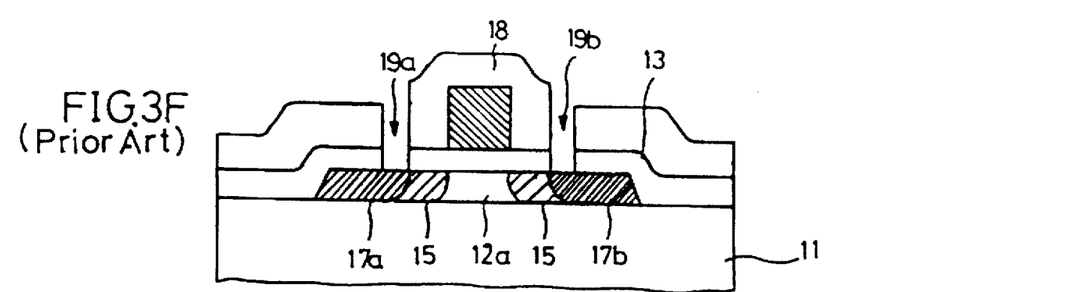

In FIG. E, after insulation layer 16 is removed, an interlayer insulation layer 18 is formed on the entire exposed surface of gate electrode 14 and gate insulation layer 13 as shown in FIG. 3F. By patterning interlayer insulation layer 18 and gate insulation layer 13, contact holes 19a and 19b are formed on source area 17a and drain area 17b.

Figure 3G:
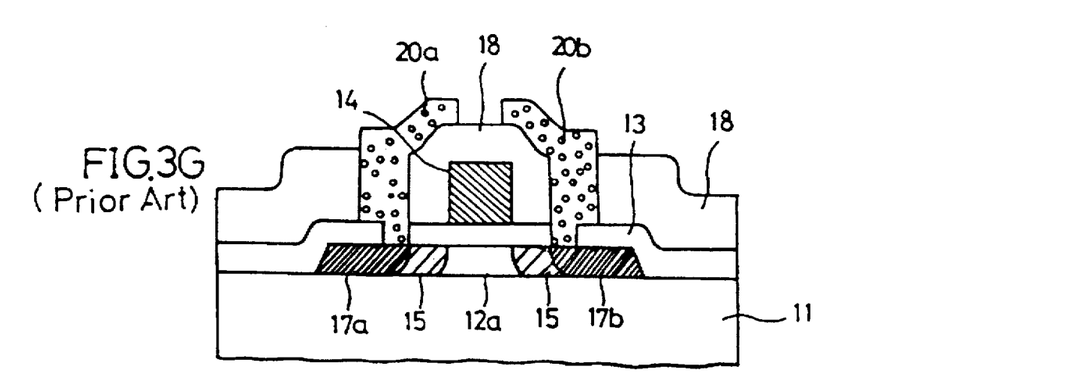

Then, as shown in FIG. 3G, a metal layer is formed on the whole exposed surface of interlayer insulation layer 18 and contact holes 19a and 19b. By patterning the metal layer, contact electrodes functioning as source region 20a and drain region 20b are formed in contact holes 19a and 19b. Here, reference numeral 12a in active layer 12 disposed below gate electrode 14 denotes a channel area.

However, since the doping density between source/drain area 17a and 17b is low, or undoped offset area exists, resistance increases and an on-current value decreases.

In comparing the single dotted line and the dotted line of FIG. 2, it is noted that the on-current value sharply falls if the offset areas increase to 1 μm (dotted line) compared with the offset areas at 0.5 μm (a single dotted line).

Also, since an aligner is employed to form such areas in the conventional technique for forming the LDD areas or offset areas, a change in length of the LDD areas or offset areas is generated. This length change disadvantageously affects uniformity between devices and between processes, thereby leading to the change of the on-current value of the TFT, and thus, lower uniformity of display capability of each cell constituting the LCD.

SUMMARY OF THE INVENTION

Accordingly, the present invention is directed to a fabrication method of thin film transistor that substantially obviates one or more of the problems due to limitations and disadvantages of the related art.

An object of the present invention is to provide a method for fabricating a thin film transistor (TFT) which does not suffer from the flicker phenomenon caused by the generation of off current, and which achieves feature uniformity between TFT devices.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the method for forming a thin film transistor includes the steps of depositing a semiconductor layer on a substrate and patterning the semiconductor layer to form an active layer, forming a gate insulation layer on the active layer and the substrate, forming a gate conductive layer on the gate insulation layer, forming a metal layer on the gate conductive layer and the gate insulation layer, forming a silicide layer by reacting the gate conductive layer with the metal layer, removing an unreacted portion of the metal layer, forming a high-density impurity region in the active layer by ion-implantation using the silicide layer as a mask, forming a gate electrode by removing the silicide layer, and forming an interlayer insulation layer on the exposed surface of the gate electrode and gate insulation layer.

In another aspect, the method for forming a thin film transistor includes the steps of depositing a semiconductor layer on a substrate and patterning the semiconductor layer to form an active layer, forming a gate insulation layer on the active layer and the substrate, forming a gate conductive layer on the gate insulation layer, forming a silicide layer on upper and side surfaces of the gate conductive layer, forming a high-density impurity region on the active layer by ion-implantation using the silicide layer as a mask, removing the silicide layer so that a gate electrode is exposed, and forming an interlayer insulation layer on an exposed surface of the gate electrode and gate insulation layer.

Accordingly, in a further aspect, the method for forming a thin film transistor includes the steps of depositing a semiconductor layer on a substrate and forming an active layer by patterning the same, forming a gate insulation layer on the exposed surface of the active layer and substrate, forming a gate conductive layer on the gate insulation layer, forming a metal layer on the exposed surface of the gate conductive layer and the gate insulation layer, forming a silicide layer by reacting the gate conductive layer with the metal layer by means of heat-treating the substrate, removing the unreacted metal layer, forming a high-density impurity region in the active layer by ion-implanting using the silicide layer as a mask, forming a gate electrode by removing the silicide layer, and forming an interlayer insulation layer on the exposed surface of the gate electrode and the gate insulation layer.

In one embodiment of the present invention, the gate conductive layer is formed larger than a desired gate electrode.

In yet another aspect, the method for forming a thin film transistor includes the steps of depositing a semiconductor layer on a substrate and forming an active layer by patterning the same, forming a gate insulation layer on the exposed surface of the active layer and substrate, forming a gate conductive layer on the gate insulation layer, selectively forming a silicide layer only on an upper and side surfaces of the gate conductive layer, forming a high-density impurity region on the active layer by ion-implanting using the silicide layer as a mask, removing the silicide layer so that the gate electrode is exposed, forming an interlayer insulation layer on the exposed surface of the gate electrode and gate insulation layer.

In one preferred embodiment of the present invention, the gate conductive layer is formed larger than the desired gate electrode. In addition, or in the alternative, the silicide layer may be formed by reacting only the gate conductive layer with a metal source gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4A:
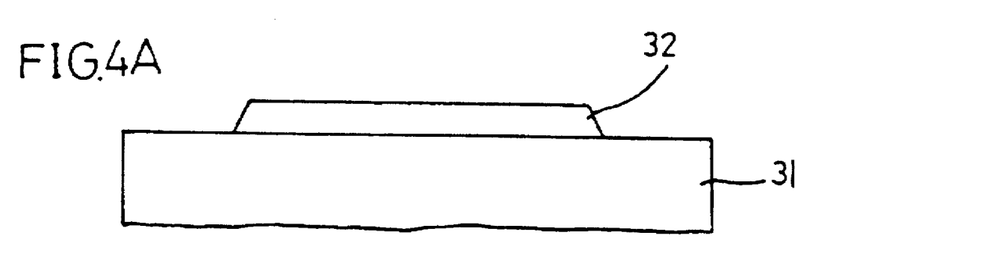
FIGS. 4A–4H are sectional views illustrating the method of forming a TFT according to the present invention.
Figure 4B:
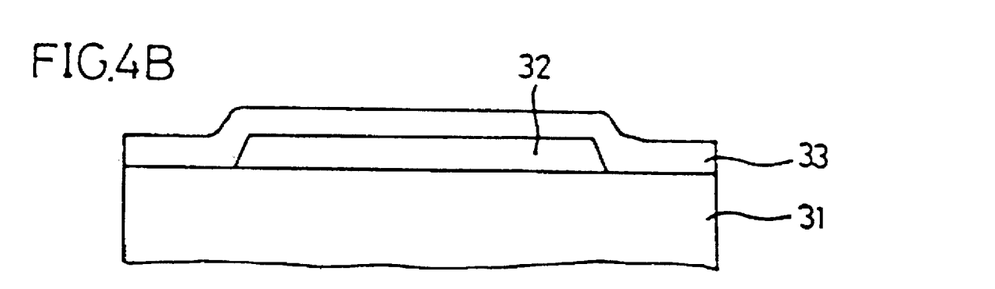

FIGS. 4A to 4H are sectional views illustrating the steps for fabricating a thin film transistor (TFT) according to the present invention. First, as shown in FIG. 4A, after a thin polysilicon film for an active layer is formed on substrate 31, the active layer 32 is formed by patterning the thin polysilicon film. In FIG. 4B, a gate insulation layer 33 is formed on the exposed substrate 31 and active layer 32. The gate insulation layer may be formed of a silicon oxide film and a silicon nitride film, for example.

Figure 4C:
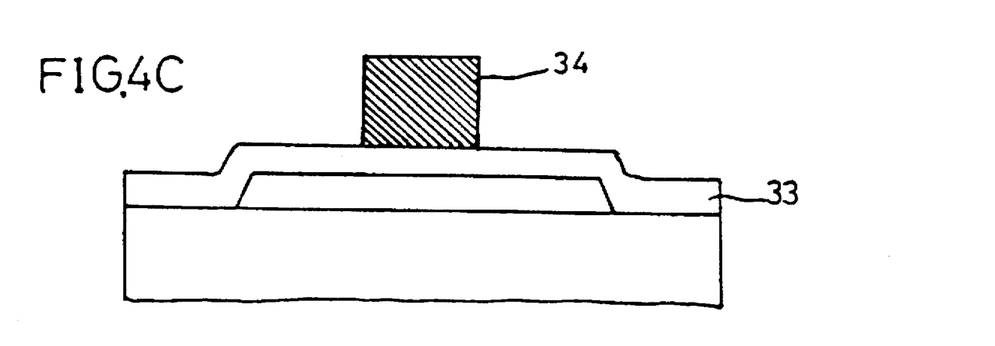

As shown in FIG. 4C, a doped polysilicon layer is formed on gate insulation layer 33. A gate conductive layer 34 is formed by patterning the doped polysilicon layer. Of course, the gate conductive layer may be formed of other materials, for example, a metal layer. Here, gate conductive layer 34 can be formed larger than the desired thickness since a portion of the gate conductive layer 34 will be used as a silicon source in the following step of forming a silicide layer. The gate conductive layer 34 is formed 0.2 to 1.0 µm thick, for example. Instead of using the deposition of the doped polysilicon layer, undoped polysilicon can be deposited and dopants can be ion implanted.

Figure 4D:
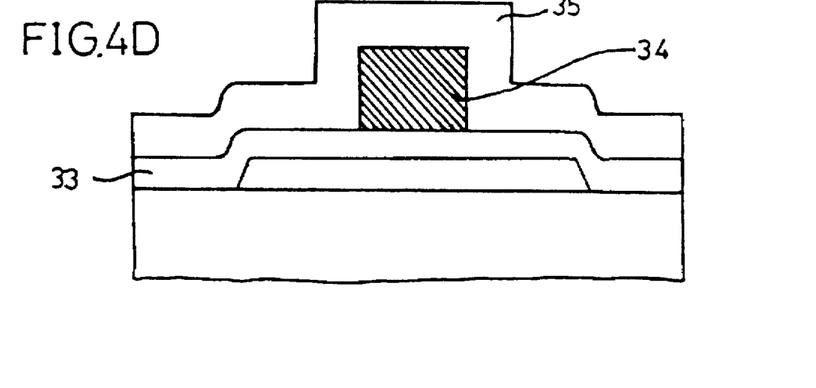

Subsequently, as shown in FIG. 4D, a metal layer 35 is formed on the entire exposed surface of gate conductive layer 34 and gate insulation layer 33. The metal layer 35 is preferably a metal which easily reacts with silicon to form a silicide, e.g., any one of tungsten (W), platinum (Pt), palladium (Pd), titanium (Ti), tantalum (Ta), cobalt (Co) and molybdenum (Mo). The metal layer 35 may be formed 1000–5000 Å thick.

Figure 4E:
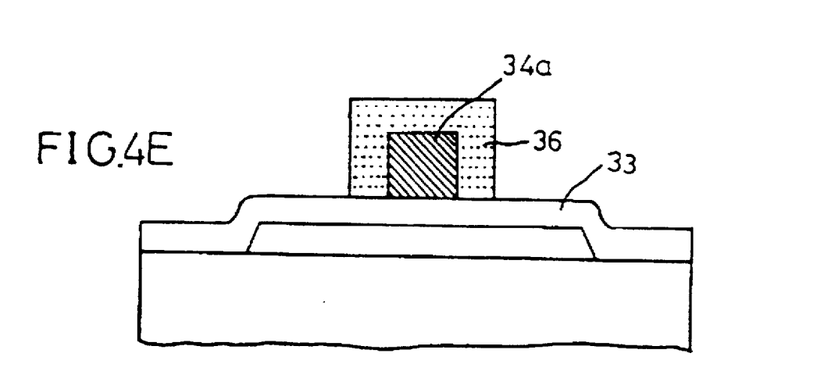

In FIG. 4E, a silicide layer 36 is formed by heat-treating the whole substrate in a furnace, using RTA (rapid thermal annealing) or a laser. The silicide layer 36 is formed by a reaction between the silicon of the gate conductive layer 34 and the metal of the metal layer 35 by means of heat. If a furnace is used, temperatures of 600° C. or less may be used. The reaction occurs in both directions from the boundary surface between metal layer 35 and gate conductive layer 34. Because an offset region or an LDD region size is determined by the thickness of silicide layer 36 in the following process, it is important to control the thickness of the silicon layer 36. A reference numeral 34a denotes a gate electrode, which is the remaining portion of gate conductive layer 34 after the silicide layer 36 is formed.

Figure 4F:
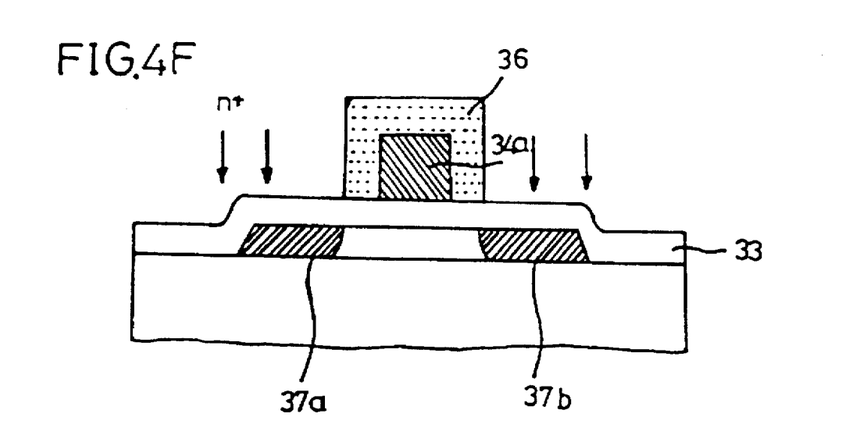

In FIG. 4F, by utilizing silicide layer 36 enclosing gate electrode 34a as a mask, a source region 37a and drain region 37b of a high-dose impurity region are formed on the active layer by implanting high-dose ions through gate insulation layer 33.

Figure 4G:
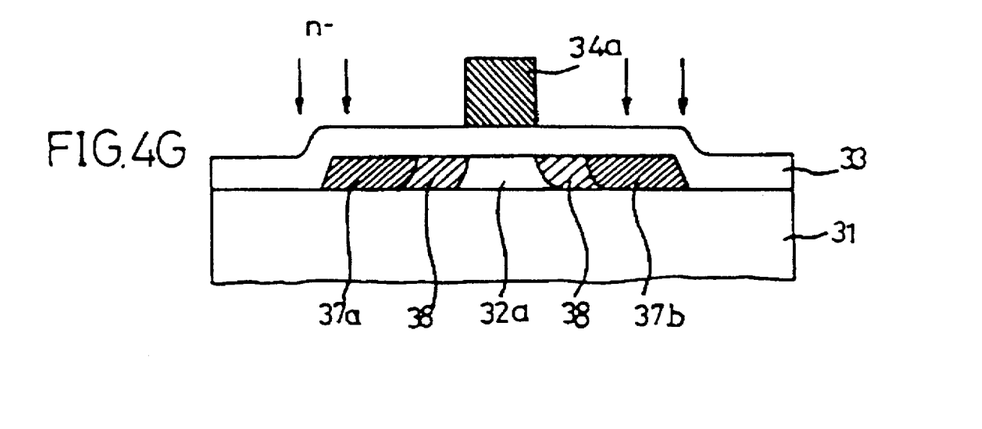

In FIG. 4G, the silicide layer is removed to expose gate electrode 34, and an LDD region 38 of a low-dose impurity region is formed on the active layer 32 through gate insulation layer 33 by utilizing gate electrode 34a as a mask. A reference numeral 32a denotes a channel area.

Figure 4H:
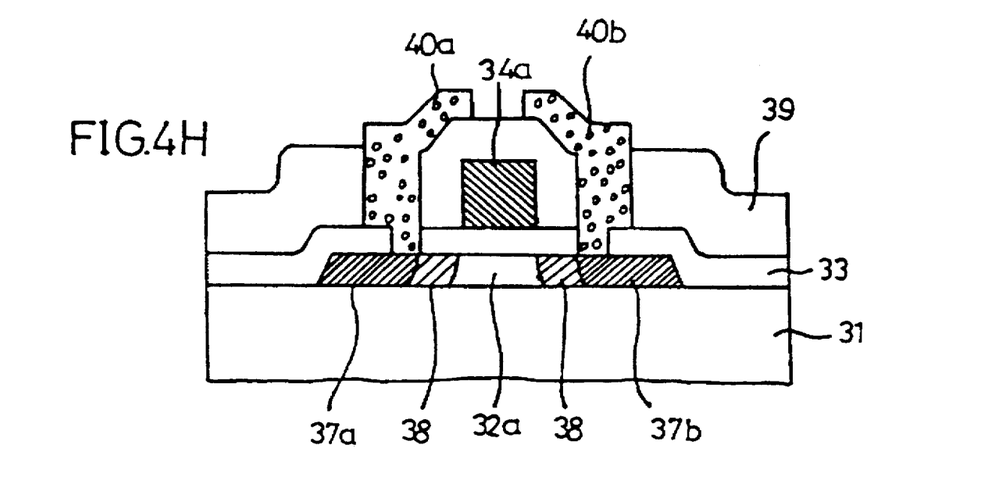

Then, as shown in FIG. 4H, an interlayer insulation layer 39 is formed on the exposed surface of gate electrode 34a and gate insulation layer 33, and contact holes are formed on source region 37a and drain region 37b by patterning interlayer insulation layer 39 and gate insulation layer 33.

Through the above steps, a TFT having a structure of a self-aligned top gate including the LDD region is fabricated.

Also, if the step of forming interlayer insulation layer 39 is performed as in FIG. 4H, without performing the ion-implantation step utilizing gate electrode 34a as a mask in the step of FIG. 4G, a TFT is fabricated having a structure of a self-aligned top gate including an offset region instead of the LDD region.

On the other hand, in the formation of the silicide layer, instead of performing the steps of FIGS. 4D to 4F, silicide layer 36 can be selectively formed on gate conductive layer 34 only after gate conductive layer 34 is formed as shown in FIG. 4C. For instance, by chemical vapor deposition (CVD) using a gas source, such as WF$_6$, a WSi$_x$ (tungsten silicide) layer can be formed only on the exposed surface of gate conductive layer 34 by utilizing gate conductive layer 34 as a silicon source. Since silicide layer 36 is formed only on the upper portion of gate conductive layer 34, a high-dose ion-implantation process can be performed as shown in FIG. 4F, instead of removing the non-reacted metal layer as shown in FIG. 4E.

As an alternative method of selectively forming a silicide layer, the silicide layer can be formed using the CVD method by supplying metal source gas along with silicon source gas, e.g., a TiSi$_x$ (titanium silicide) layer can be formed using TiCl$_4$ and SiH$_4$ as metal and silicon source, respectively. In this case, unlike the above two cases, since an additional silicon source is not supplied and the silicon of gate conductive layer 34 is not consumed for the formation of the silicide layer, it is possible that the gate conductive layer can be formed the same size as the gate electrode 34a.

In forming the LDD region or offset region, the TFT of a self-aligned top gate structure of the present invention uses a silicide layer formed with a constant thickness above gate conductive layer 34 without using an additional aligner. Thus, the constant offset or LDD regions can be formed.

It will be apparent to those skilled in the art that various modifications and variations can be made in the fabrication method of thin film transistor of the present invention without departing from the spirit or scope of the invention. Thus, it is intended that the present invention cover the modifications and variations of this invention provided they come within the scope of the appended claims and their equivalents.

What is claimed is:

1. A method for forming a thin film transistor comprising the steps of:
   (a) depositing a semiconductor layer on a substrate and patterning the semiconductor layer to form an active layer;
   (b) forming a gate insulation layer on the active layer and the substrate;
   (c) forming a gate conductive layer on the gate insulation layer;
   (d) forming a metal layer on the gate conductive layer and the gate insulation layer;
   (e) forming a silicide layer by reacting the gate conductive layer with the metal layer;
   (f) removing an unreacted portion of the metal layer;
   (g) forming a high-dose impurity region in the active layer by ion-implantation using the silicide layer as a mask;
   (h) forming a gate electrode by removing the silicide layer;
   (I) forming a low-dose impurity region in the active layer by ion-implanting through the gate insulation layer using the gate electrode as a mask, after step (h);
   (j) forming an interlayer insulation layer on the exposed surface of the gate electrode and gate insulation layer.

2. A method of forming a thin film transistor comprising the steps of:
   (a) depositing a semiconductor layer on a substrate and patterning the semiconductor layer to form an active layer;
   (b) forming a gate insulation layer on the active layer and the substrate;
   (c) forming a gate conductive layer on the gate insulation layer;
   (d) forming a silicide layer on upper and side surfaces of the gate conductive layer;
   (e) forming a high-dose impurity region on the active layer by ion-implantation using the silicide layer as a mask;
   (f) removing the silicide layer so that a gate electrode is exposed;
   (g) forming a low-dose impurity region in the active layer by ion-implanting through the gate insulation layer using the gate electrode as a mask, after step (f);
   (h) forming an interlayer insulator on an exposed surface of the gate electrode and gate insulation layer.

3. The method for forming a thin film transistor according to claim 1, wherein the silicide layer is formed during a heat-treatment.

4. The method for forming a thin film transistor according to claim 1, wherein the gate conductive layer is formed larger than the gate electrode.

5. The method for forming a thin film transistor according to claim 4, wherein the step of forming the gate conductive layer includes the steps of forming a doped polysilicon layer on the gate insulation layer, and patterning the doped polysilicon layer.

6. The method for forming a thin film transistor according to claim 1, wherein the step of forming the gate conductive layer includes the steps of forming a doped polysilicon layer on the gate insulation layer, and patterning the doped polysilicon layer.

7. The method for forming a thin film transistor according to claim 3, wherein the heat treatment uses a furnace at temperatures of 600° C. or less.

8. The method for forming a thin film transistor according to claim 1, wherein in the step of forming the silicide layer, a heat treatment is performed using a furnace at temperatures of 600° C. or less.

9. The method for forming a thin film transistor according to clam 3, wherein the heat treatment is performed using a laser.

10. The method for forming a thin film transistor according to claim 4, Wherein in the step of forming the silicide layer, a heat treatment is performed using a laser.

11. The method for forming a thin film transistor according to claim 1, wherein the semiconductor layer is formed of polysilicon.

12. The method for forming a thin film transistor according to claim 2, wherein the gate conductive layer of step (c) is formed larger than the gate electrode, and a silicide layer of step (d) is formed by reacting substantially only the gate conductive layer with a metal source gas.

13. The method for forming a thin film transistor according to claim 2, wherein the silicide layer of step (d) is formed by supplying a metal source gas with a silicon source gas.

14. The method for forming a thin film transistor according to claim 2, wherein the step of forming a gate conductive layer includes the steps of:

forming an undoped polysilicon layer on the gate insulation layer;

patterning the undoped polysilicon layer; and ion-implanting dopants in the undoped polysilicon layer.

15. The method for forming a thin film transistor according to claim 12, wherein the step of forming the gate conductive layer includes the steps of:

forming an undoped polysilicon layer on the gate insulation layer;

patterning the undoped polysilicon layer; and ion-implanting dopants in the undoped polysilicon layer.

16. The method for forming a thin film transistor according to claim 12, wherein the step of forming the gate conductive layer includes the steps of forming a doped polysilicon layer on the gate insulation layer, and patterning the doped polysilicon layer.

17. The method for forming a thin film transistor according to claim 12, wherein the step of forming the gate conductive layer includes the Steps of forming a doped polysilicon layer on the gate insulation layer, and patterning the doped polysilicon layer.

18. The method for forming a thin film transistor according to claim 12, wherein the semiconductor layer is formed of polysilicon.

* * * * *

UNITED STATES PATENT AND TRADEMARK OFFICE
CERTIFICATE OF CORRECTION

PATENT NO. : 5,677,207
DATED : October 14, 1997
INVENTOR(S) : Yong Min HA

It is certified that error appears in the above-indentified patent and that said Letters Patent is hereby corrected as shown below:

Column 7, line 15, change "claim 4" to --claim 2--.

Column 7, line 15, change "Wherein" to --wherein--.

Column 8, line 13, change "claim 12" to --claim 2--.

Column 8, line 22, change "Steps" to --steps--.

Column 8, line 26, change "claim 12" to --claim 2--.

Signed and Sealed this

First Day of June, 1999

Attest:

Q. TODD DICKINSON

Attesting Officer    Acting Commissioner of Patents and Trademarks